(12) United States Patent
Angelini et al.

(10) Patent No.: US 11,675,024 B2
(45) Date of Patent: Jun. 13, 2023

(54) HALL SENSOR READOUT CIRCUIT, CORRESPONDING DEVICE AND METHOD

(71) Applicant: STMicroelectronics S.r.l., Agrate Brianza (IT)

(72) Inventors: Paolo Angelini, Bologna (IT); Roberto Pio Baorda, Milan (IT); Danilo Karim Kaddouri, Pero (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/211,149

(22) Filed: Mar. 24, 2021

(65) Prior Publication Data

US 2021/0208212 A1    Jul. 8, 2021

Related U.S. Application Data

(63) Continuation of application No. 16/013,558, filed on Jun. 20, 2018, now abandoned.

(30) Foreign Application Priority Data

Jun. 26, 2017    (IT) .......................... 102017000071213

(51) Int. Cl.
  *G01R 33/07*     (2006.01)
  *G01R 33/00*     (2006.01)
  *G01R 15/20*     (2006.01)

(52) U.S. Cl.
  CPC ......... *G01R 33/0017* (2013.01); *G01R 33/07* (2013.01); *G01R 33/075* (2013.01); *G01R 15/202* (2013.01)

(58) Field of Classification Search
  CPC .. G01R 33/0017; G01R 33/07; G01R 33/075; G01R 33/0029; G01R 33/0035;
  (Continued)

(56) References Cited

U.S. PATENT DOCUMENTS 6,433,544 B1 * 8/2002 Motz ...................... G01R 33/07
                                                   338/324
2012/0153945 A1    6/2012 Ezekwe
              (Continued)

FOREIGN PATENT DOCUMENTS

FR    2947060 A1    12/2010
WO    2016036372 A1    3/2016

OTHER PUBLICATIONS

IT Search Report and Written Opinion for IT Appl. No. 102017000071213 dated Feb. 19, 2018 (9 pages).

(Continued)

*Primary Examiner* — David M Schindler
(74) *Attorney, Agent, or Firm* — Crowe & Dunlevy

(57) ABSTRACT

Hall sensing signals are received in a spinning readout pattern of subsequent readout phases, wherein the pattern is cyclically repeated at a spinning frequency and a polarity of the Hall sensor signals is reversed in two non-adjacent readout phases of the readout pattern. A signal storage circuit includes signal storage capacitors. An accumulation circuit includes accumulation capacitors. A switch network is selectively actuated to couple the signal storage capacitors with the accumulation capacitors synchronously with phases in the spinning readout pattern in subsequent alternating first and second periods. The spinning output is stored with alternating opposite signs on the signal storage capacitors and the Hall sensing signals are stored in the signal storage capacitors and then accumulated on the accumulation capacitors with alternate signs in subsequent periods. The accumulated output signal is then demodulated with a demodulation frequency half the spinning frequency.

11 Claims, 4 Drawing Sheets

(58) Field of Classification Search
CPC .............. G01R 33/0041; G01R 33/072;
G01R 33/077; G01R 33/09; G01R
33/091; G01R 33/093; G01R 33/095;
G01R 33/096; G01R 33/098; G01R
15/202; G01B 7/14; G01B 7/30; G01D
5/142; G01D 5/145; G01D 5/147
See application file for complete search history.

(56) References Cited

U.S. PATENT DOCUMENTS

| | | | | |
|---|---|---|---|---|
| 2012/0223704 | A1* | 9/2012 | Hayashi | G01D 5/147 |
| | | | | 324/244 |
| 2012/0229204 | A1* | 9/2012 | Han | H03H 19/004 |
| | | | | 330/69 |
| 2013/0335066 | A1 | 12/2013 | Cesaretti et al. | |
| 2014/0028286 | A1* | 1/2014 | Hu | G01R 15/202 |
| | | | | 324/117 H |
| 2015/0100263 | A1 | 4/2015 | Venzal et al. | |
| 2016/0061912 | A1 | 3/2016 | van Vroonhoven | |
| 2016/0161571 | A1 | 6/2016 | Schaffer et al. | |
| 2016/0370440 | A1 | 12/2016 | Okatake et al. | |
| 2017/0030983 | A1 | 2/2017 | Crescentini et al. | |
| 2017/0363445 | A1 | 12/2017 | Polley et al. | |

OTHER PUBLICATIONS

Chen, Xiaoqing et al., "A novel Hall dynamic offset cancellation circuit based on four-phase spinning current technique" presented at the Semiconductor Technology International Conference (CSTIC), Shanghai, China, Mar. 15-16, 2015.

* cited by examiner

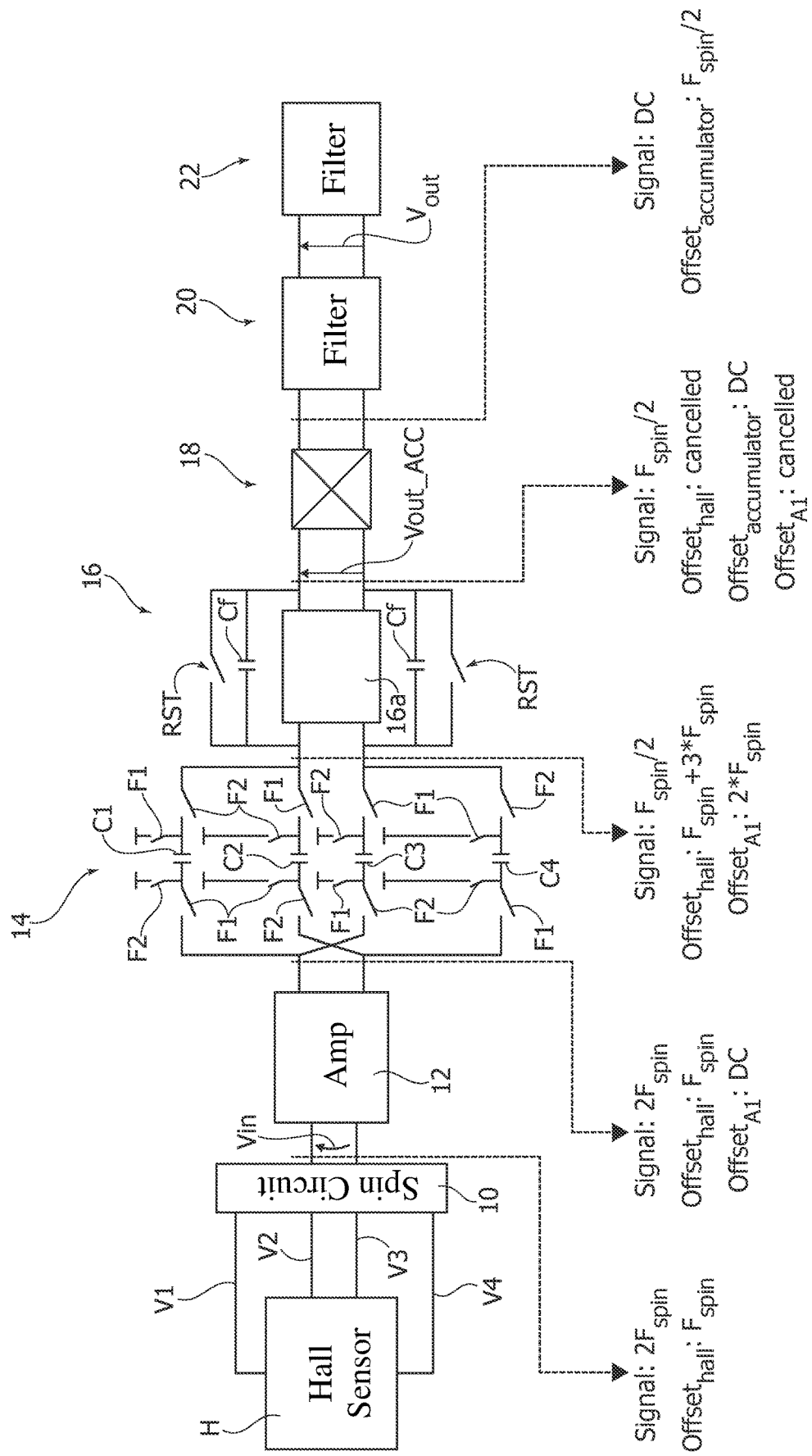

HALL SENSOR READOUT CIRCUIT, CORRESPONDING DEVICE AND METHOD

CROSS REFERENCE TO RELATED APPLICATIONS

This application is a continuation of U.S. patent application Ser. No. 16/013,558, filed Jun. 20, 2018 (now abandoned), which claims the priority benefit of Italian Application for Patent No. 102017000071213, filed on Jun. 26, 2017, the contents of which are hereby incorporated by reference in their entireties to the maximum extent allowable by law.

TECHNICAL FIELD

The description relates to readout circuits.

One or more embodiments may provide a readout circuit for a Hall sensor element for current sensing applications.

BACKGROUND

A technique currently referred to as "spinning" is conventionally used for Hall sensor readout in order to reduce the effects of Hall sensor offset.

In a conventional arrangement, a Hall-modulated signal can be amplified in an amplifier stage to be then demodulated and low-pass filtered to cancel out Hall sensor offset, amplifier stage offset and 1/f noise.

A (very) selective low-pass filter may be employed for that purpose. Spinning the Hall phases at a (very) high frequency may also be adopted in order to facilitate ripple reduction. By resorting to such an approach offset and 1/f noise of the low-pass filter cannot be filtered adequately.

The reference by Chen et al., "A novel Hall dynamic offset cancellation circuit based on four-phase spinning current technique" presented at the Semiconductor Technology International Conference (CSTIC), Shanghai, China, 15-16 March, 2015 (incorporated by reference), discloses an arrangement where a Hall-modulated signal is amplified by a first amplifier stage to be then demodulated by a circuit which introduces a zero in the transfer function at $F_{spin}$ providing ripple cancellation.

The circuit used to obtain ripple cancellation introduces 1/f noise and offset. Additionally such an arrangement may involve using a type of sample and hold (S&H) circuit which may not be practical in various applications.

There is accordingly a need in the art to provide a solution addressing the foregoing outlined drawbacks.

SUMMARY

One or more embodiments provide a circuit adapted to comply with high-bandwidth (for example 200 kHz) and low-noise specifications.

One or more embodiments address issues related to the possible presence of ripple due to the demodulation of the Hall signal in those arrangements where the Hall signal is demodulated to baseband with a view to filtering out offset, with current spinning performed (for example at a frequency $F_{spin}$) in order to cancel out offset.

One or more embodiments may facilitate cancelling the ripple introduced by spinning the Hall current by using a discrete-time accumulator (SC accumulator) to amplify and modulate the Hall sensor signal with phase generation and sample and hold processing used to chop the accumulator in order to reduce offset and 1/f noise therein.

One or more embodiments may provide one or more of the following advantages:
high bandwidth,
low noise,
high temperature stability, and
high accuracy.

One or more embodiments may facilitate offset and 1/f noise cancellation in connection with the Hall sensor and an (amplifier) stage possibly associated therewith as well as in a ripple cancellation block by introducing a chopper function at a frequency $F_{chop}=F_{spin}/2$.

In one or more embodiments, an accumulator having a gain of four may be used which facilitates relaxing the requirements for an associated low-pass filter and amplifier stage.

One or more embodiments may facilitate cancelling output ripple as caused by a spinning technique.

In an embodiment, a circuit comprises: a spinning circuit configured for receiving signals from a Hall sensor in a spinning readout pattern of subsequent readout phases, the pattern cyclically repeated at a spinning frequency, wherein the spinning circuit is configured for reversing (inverting) the polarity of the sensor signals in two non-adjacent readout phases in the readout pattern; a signal storage circuit, including a first and a second set of signal storage capacitors; an accumulation circuit including a set of accumulation capacitors; a network of switches selectively actuatable for coupling the first and second set of signal storage capacitors in the signal storage circuit with the output from the spinning circuit and with the accumulation capacitors in the accumulation circuit, wherein the switches in the network of switches are actuatable synchronously with the phases in the spinning readout pattern in subsequent alternating first and second periods, with the output from the spinning circuit stored with alternating opposite signs on the first and second set of signal storage capacitors and the sensing signal stored in the first and second set of signal storage capacitors accumulated on the accumulation capacitors with alternate signs in subsequent periods; and a demodulator circuit active on the signal from the accumulation circuit with a demodulation frequency half the spinning frequency.

In one or more embodiments, the accumulation capacitors in the accumulation circuit may be resettable at each period in said subsequent alternating first and second periods.

In one or more embodiments, the accumulation capacitors in the accumulation circuit may be resettable at intervals of four accumulation phases of the signal from the spinning circuit stored in the first and second set of signal storage capacitors.

In one or more embodiments, the demodulator circuit may include a sample and hold circuit, actuatable for sampling the signal from the accumulation circuit with alternate positive and negative signs with a sampling frequency equal to said spinning frequency.

One or more embodiments may include an amplifier stage between the spinning circuit and the signal storage circuit.

One or more embodiments may include at least one low-pass filter active on the output from the demodulator circuit to filter out the accumulation circuit offset.

One or more embodiments may include a low-pass filter at least partly integrated in the demodulator circuit.

In an embodiment, a device comprises: a Hall sensor providing Hall sensor signals; and a spinning circuit coupled with the Hall sensor for receiving therefrom said signals in said spinning readout pattern of subsequent readout phases.

In one or more embodiments, a method comprises: receiving signals from a Hall sensor in a spinning readout pattern of subsequent readout phases, the pattern cyclically repeated at a spinning frequency, by reversing the polarity of the sensor signals in two non-adjacent readout phases in the readout pattern; storing the sensor signals with said reversed polarity in a first and a second set of signal storage capacitors and accumulating the sensor signals stored in a set of accumulation capacitors, by selectively feeding the sensor signals with said reversed polarity to the first and second set of signal storage capacitors synchronously with the phases in the spinning readout pattern in subsequent alternating first and second periods, and the sensor signals with reversed polarity stored with alternating opposite signs on the first and second set of signal storage capacitors accumulated on the accumulation capacitors with alternate signs in subsequent periods in the subsequent alternating first and second periods; and demodulating the accumulated signal with a demodulating frequency half said spinning frequency.

BRIEF DESCRIPTION OF THE DRAWINGS

One or more embodiments will now be described, by way of example only, with reference to the annexed figures, wherein:

FIG. 4 is another circuit diagram substantially corresponding to the diagram of FIG. 2 providing further details on possible operation of embodiments.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

A Hall sensor as discussed herein can be regarded as a distributed resistive Wheatstone bridge provided with a set of pairs of nodes, for example four nodes or "pads" which can be designated (in an orderly manner) V1, V2, V3 and V4 based on the output sensing voltages which can be sensed at such nodes.

According to principles which are known per se (thus making it unnecessary to provide a more detailed description herein) a conventional spinning readout pattern of a four-pad Hall sensor involves rotating by steps of, for instance, 90°, the bias current(s) Ipol as schematically shown in FIGS. 1A-1D.

Figure 1A:
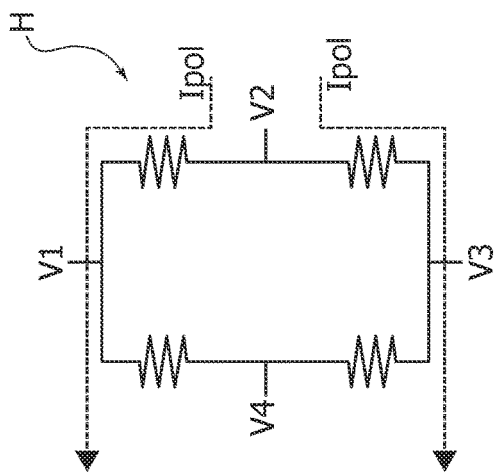
FIGS. 1A-1D illustrate in an exemplary manner a "spinning" readout of a Hall sensor.
Figure 1B:
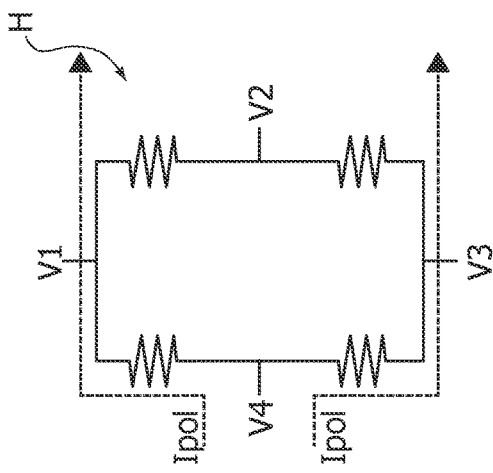
Figure 1C:
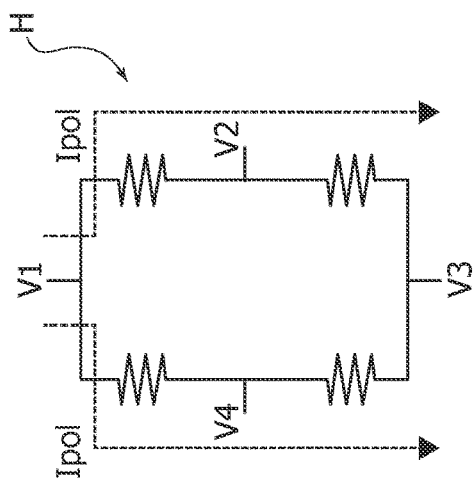
Figure 1D:
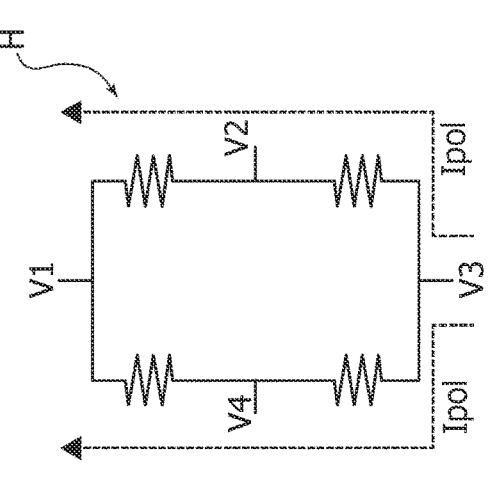

The spinning circuit will correspondingly include a set of switches which are used to couple the pads of the Hall plate (V1, V2, V3 and V4) to the bias circuit and to the input of a reading chain to sense the signals V1, V2, V3 and V4 in four phases which are repeated cyclically at a frequency $F_{spin}$, and where the connections of the pads as used for sensing are correspondingly similarly "rotated" or "spun" (for example clockwise):

Phase 1: the bias current flows from V1 to V3 (that is, "down" as shown in FIG. 1A); positive output connected to V2, negative output connected to V4;

Phase 2: the bias current flows from V2 to V4 (that is, "to the left" as shown in FIG. 1B); positive output connected to V3, negative output connected to V1;

Phase 3: the bias current flows from V3 to V1 (that is, "up" as shown in FIG. 1C); positive output connected to V4, negative output connected to V2;

Phase 4: the bias current flowing from V4 to V2 (that is, "to the right" as shown in FIG. 1D); positive output connected to V1, negative output connected to V3.

Such a spinning readout pattern of a Hall sensor may be regarded as involving a readout cycle (repeated at a frequency $F_{spin}$) of an ordered sequence of pads, for example V1, V2, V3, V4 which are arranged in pairs of opposed pads (for example V1-V3 and V2-V4).

Such a spinning readout pattern will thus include subsequent adjacent phases wherein a bias current "spins" ("down", "to the left", "up", "to the right", "down" and so on, that is by angular steps of, for instance, 90° as exemplified in FIGS. 1A-1D), that is flows between a first pair of opposed sensor pads and an output voltage is sensed across a second pair (different from the first pair) of opposed sensor pads, with the first and second pairs of pads "rotated" or "spun" (clockwise or counterclockwise), that is varied stepwise according to the ordered sequence of the pads, so that at each rotation/spinning step each pad is, so to say, "replaced" by an adjacent pad in the sequence when spinning proceeds for one readout phase to an adjacent phase.

In one or more embodiments as exemplified herein the pads V1, V2, V3 and V4 from the Hall sensor H (which per se may be distinct from the embodiments) are connected to a spinning circuit 10 to provide to an amplifier stage (Amp) 12 a sensing signal Vin obtained according to a spinning readout pattern of the pads V1, V2, V3 and V4 as discussed in the following.

Reference 14 denotes a demodulator circuit configured for operating (as discussed in the following) as a demodulator at frequency $F_{spin}$ (equal to the spinning frequency).

In one or more embodiments as exemplified herein, the demodulator circuit 14 includes four capacitors C1, C2, C3, C4 set between the amplifier stage 12 and an accumulator stage 16 including an operational amplifier (opamp 16a).

The capacitors C1, C2, C3, C4 can be selectively coupled to the outputs of the amplifier stage 12: a differential layout is assumed as conventionally used for amplifying the output Vin from a spinning circuit 10, which—as discussed previously—may be by itself differential.

Coupling is via a set of switches such as electronic switches, for example MOSFET transistors. These switches are designated F1 and F2 in the figures in compliance with their "on" (conductive) and "off" (non-conductive) states as discussed in the following.

Further switches coupled to the opposed ends of the capacitors C1, C2, C3, C4 a general "pi" layout permit to selectively set to ground either one of the opposed ends of the capacitors C1, C2, C3, C4. These further switches may again be electronic switches, for example MOSFET transistors and are again designated F1 and F2 in the figures in compliance with their "on" (conductive) and "off" (non-conductive) states as discussed in the following.

Still further switches permit to couple the capacitors C1, C2, C3, C4 to the (differential) inputs of an accumulator stage 16 including a (differential) operational amplifier 16a with feedback capacitors Cf coupled each between one of the (differential) outputs of the operational amplifier 16a and a homologous (differential) input of the of the operational amplifier 16a.

Once again:
- coupling of the capacitors C1, C2, C3, C4 to the accumulator stage 16 may be via electronic switches, for example MOSFET transistors,
- these coupling switches are designated F1 and F2 in the figures in compliance with their "on" (conductive) and "off" (non-conductive) states as discussed in the following.

Two further such switches (for example MOSFET transistors) designated RST are coupled to the capacitors Cf in the accumulator stage 16 with the capability of selectively short-circuiting (resetting) the feedback capacitors Cf coupled to the operational amplifier 16a.

As discussed in the following, the various switches F1, F2 and the switches RST can be regarded as operating as a chopper at a frequency $F_{chop}$ equal to half the spinning frequency $F_{spin}$ (that is, $F_{chop} = F_{spin}/2$).

The (differential) output Vout_ACC from the accumulator 16 is fed to a demodulator (for example a sample and hold) circuit 18 intended to operate at the chopping frequency $F_{chop}$ ($F_{chop} = F_{spin}/2$) followed by a (1st order) low pass filter 20 (here shown as a distinct element, but possibly included in the demodulator block 18) providing an output signal Vout, possibly followed by a (2nd order) low-pass filter 22.

Clocking signals for the various circuits and the switches (for example F1, F2, RST) as discussed herein can be derived from (otherwise conventional) clock circuitry not visible in the figures for simplicity of representation.

Figure 2:
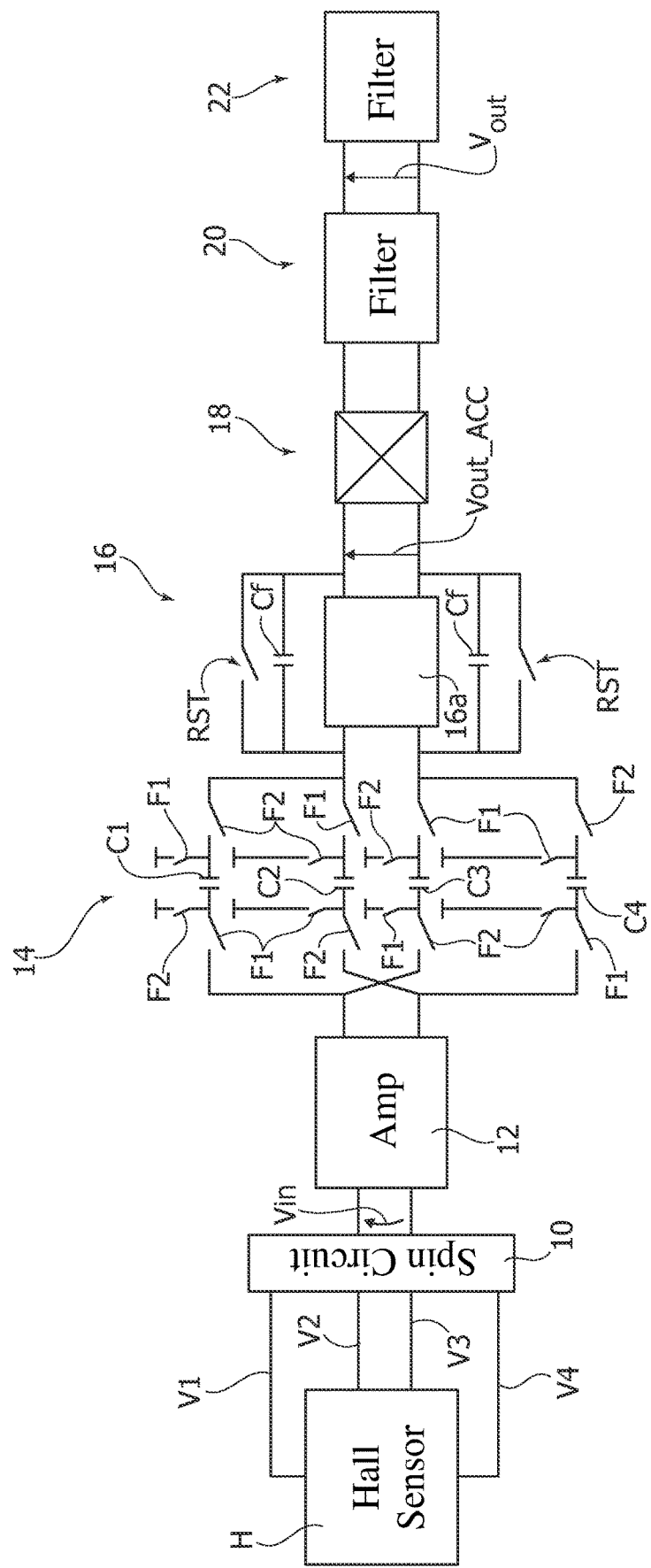
FIG. 2 is a block diagram exemplary of embodiments, FIG. 3 includes seven superposed time diagrams, referred to a common abscissa time scale, exemplary of signals which may be generated in embodiments.

In one or more embodiments as exemplified herein, the conventional spinning scheme as discussed previously can be modified (for example in the spinning circuit 10) in the following way:
- Phase RST: the bias current Ipol flows from V1 to V3; with the output Vin (in FIGS. 2 and 4) taken as a positive output connected to V2 and negative output connected to V4;
- Phase 1: the bias current Ipol flows from V2 to V4; positive output connected to V1, negative output connected to V3
- Phase 2: Bias current flowing from V3 to V1; positive output connected to V4, negative output connected to V2
- Phase 3: Bias current flowing from V4 to V2; positive output connected to V3, negative output connected to V1.

As noted, the sign of the output voltages in Phases 1 and 3 (i.e., subsequent, non-adjacent phases) is here reversed (V1−V3 and V3−V1, respectively) in comparison the output voltages in Phases 2 and 4 (V3−V1 and V1−V3, respectively) in conventional spinning as discussed previously.

As discussed in the following, in one or more embodiments a further phase (Phase 4) may be envisaged for timing operation of the accumulator circuit 16, where the connections of the Hall sensor nodes V1, V2, V3 and V4 essentially amount to a "don't care" condition, such a phase possibly being (much) shorter than the others.

The spinning readout pattern of one or more embodiments as discussed above can again be regarded as a readout cycle (adapted to be repeated at a frequency $F_{spin}$) of an ordered sequence of pads, for example V1, V2, V3, V4 which are arranged in pairs of opposed pads (for example V1−V3 and V2−V4). Such a spinning readout pattern will again include subsequent phases wherein a bias current flows between a first pair of opposed sensor pads and an output voltage is sensed across a second pair (different from the first pair) of opposed sensor pads, with the first and second pairs of pads "rotated" or "spun", that is varied stepwise according to the ordered sequence of the pads, so that each pad is, so to say, "replaced" by an adjacent pad in the sequence when spinning proceeds for one readout phase to an adjacent phase.

In one or more embodiments as exemplified herein the signs of the output voltages in two phases non-adjacent readout phases (for example Phases 1 and 3 as exemplified herein) is "reversed", that is sign-inverted (for example V1−V3 and V3−V1, respectively) if compared with respect to the output voltages (for example V3−V1 and V1−V3, respectively) in the homologous phases (for example Phases 2 and 4) in conventional spinning as discussed previously.

This reversal can be regarded as a modulation of a useful Hall sensing signal Vs at a frequency $2*F_{spin}$, where $F_{spin}$ is the frequency of a complete spinning cycle. For instance, by assuming that the "useful" signal lies within a certain band $F_b \ll F_{spin}$, while in conventional spinning the signal remains in a band+/−$F_b$ around DC, in the modified "reversed" or "sign inverted" spinning of one or more embodiments, the signal is moved to a band+/−$F_b$ around $2*F_{spin}$.

On the other hand, the Hall sensor offset voltage $Offset_{Hall}$ (briefly, the Hall offset) associated with the "useful" component Vs of the signal $V_{in}$ is modulated at $F_{spin}$ since it is different in each one of the four phases.

After the amplifier 12 (which may be a conventional time-continuous voltage amplifier) the useful signal Vs is still modulated at $2*F_{spin}$, with the offset voltage $Offset_{Hall}$ still modulated at $F_{spin}$, with an amplifier offset $Offset_{A1}$ (constant at DC) appearing at the output of the amplifier 12.

Figure 3:
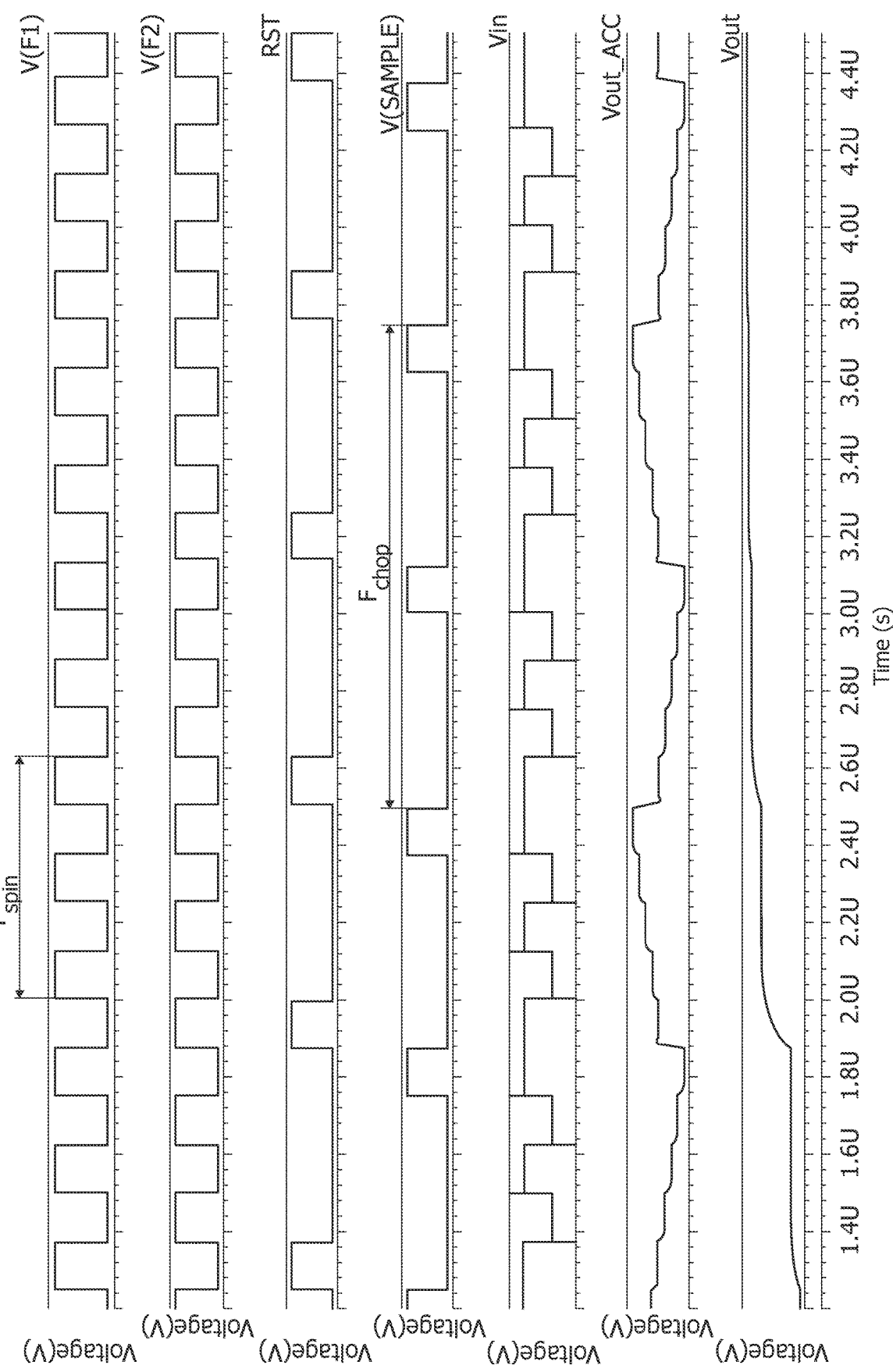

The time diagrams of FIG. 3 are exemplary of a possible coordinated time behavior (for example with a common abscissa time scale) of the following signals (from top to bottom):
- control signals V(F1) and V(F2) of the switches F1 and F2: when V(F1) or V(F2) high=switch "on", namely conductive; when V(F1) or V(F2) low=switch "off", namely non-conductive;
- control signals RST the switches RST in the accumulator circuit 16: when RST high=switch "on", namely conductive; when RST low=switch "off", namely non-conductive;
- sampling signal V(SAMPLE) controlling the demodulator (for example sample & hold) circuit 18;
- output signal Vin from the spinning circuit 10 (modulated at $2F_{spin}$ with offset modulated at $F_{spin}$);
- output signal Vout_ACC from the accumulator circuit 16;
- output signal Vout from the sample & hold circuit 20.

In FIG. 3, the timing of the signals VF(1)—and VF(2)—is also shown compared with the (period 1/$F_{spin}$ corresponding to the) frequency $F_{spin}$, while the timing of the signals V(SAMPLE) is shown compared with the (period 1/$F_{chop}$ corresponding to the) frequency $F_{chop} = F_{spin}/2$.

For the sake of clarity of explanation, as shown in FIG. 3, the period 1/$F_{spin}$ encompasses 2.5 periods of VF(1) and VF(2) and the period 1/$F_{chop}$ encompasses 5 periods of VF(1) and VF(2). It will be otherwise appreciated that, as noted previously, in one or more embodiments, Phase 4 may be (even much) shorter than the others so that 2.5 may de facto correspond to 2, while 5 may de facto correspond to 4.

As exemplified in FIG. 3, the switches F1, F2 can be operated with just two control signals V(F1), V(F2) in order to implement the following mode of operation arranged over two alternating periods, namely Period 1 and Period 2.

Period 1

Phase RST: RST is high, F1 is high and F2 is low; the feedback capacitors Cf are reset to zero differential voltage and in the meantime the input signal is sampled with positive sign on the input capacitors C1 and C4.

Phase 1: RST is low, F1 is low and F2 is high; the input signal stored in C1 and C4 during phase RST is transferred to the accumulation capacitors Cf connected in a feedback loop in the accumulator circuit 16; in the meantime, the input signal is sampled with negative sign on the input capacitors C3 and C2.

Phase 2: RST is low, F1 is high and F2 is low; the input signal stored in C3 and C2 during Phase 1 is transferred to the accumulation capacitors Cf; in the meanwhile, the input signal is sampled with positive sign on the input capacitors C1 and C4.

Phase 3: RST is low, F1 is low and F2 is high; the input signal stored in C1 and C4 during Phase 2 is transferred to the accumulation capacitors Cf; in the meantime, the input signal is sampled with negative sign on the input capacitors C3 and C2.

Phase 4: RST is low, F1 is high and F2 is low; the input signal stored in C3 and C2 during Phase 3 is transferred to the accumulation capacitors Cf connected in feedback.

Period 2

Phase RST: RST is high, F1 is low and F2 is high; the feedback capacitors Cf are reset to zero differential voltage and in the meantime the input signal is sampled with negative sign on the input capacitors C3 and C2.

Phase 1: RST is low, F1 is high and F2 is low; the input signal stored in C3 and C2 during phase RST is transferred to the accumulation capacitors Cf; in the meantime the input signal is sampled with positive sign on the input capacitors C1 and C4.

Phase 2: RST is low, F1 is low and F2 is high; the input signal stored in C1 and C4 during Phase 1 is transferred to the accumulation capacitors Cf; in the meantime, the input signal is sampled with negative sign on the input capacitors C3 and C2.

Phase 3: RST is low, F1 is high and F2 is low; the input signal stored in C3 and C2 during Phase 2 is transferred to the accumulation capacitors Cf; in the meantime, the input signal is sampled with positive sign on the input capacitors C1 and C4.

Phase 4: RST is low, F1 is low and F2 is high; the input signal stored in C1 and C4 during Phase 3 is transferred to the accumulation capacitors Cf connected in feedback.

Once again it will be recalled that, in one or more embodiments, Phase 4 may actually be much shorter than the others.

The arrangement just discussed (circuits 14 and 16 in FIGS. 2 and 4) may thus be regarded as including:
 a first set of signal storage capacitors, C1 and C4,
 a second set of signal storage capacitors, C3 and C2,
 a set of accumulation capacitors Cf, and
 a network of switches (those designated F1, F2) selectively activatable under the control of signals V(F1) and V(F2) for coupling the first (C1, C4) and second set (C3, C2) of signal storage capacitors in the circuit 14 with the output from the spinning circuit 10 (via the amplifier 12) and with the accumulation capacitors Cf in the accumulator circuit 16.

In an embodiment as exemplified herein, the switches F1, F2 are actuatable synchronously (that is, in a timed relationship) with the phases RST, Phase 1, Phase 2, Phase 3 and Phase 4 in the spinning readout pattern in two alternating periods, Period 1 and Period 2. In the phases of the two periods, the sensing signal Vin from the spinning circuit (as received via the amplifier 12) is thus stored (sampled) with alternating opposite signs on the first (C1, C4) and second set (C3, C2) of signal storage capacitors (for example positive on C1, C4 and negative on C3, C2 in the first period resp. negative on C1, C4 and positive on C3, C2 in the second period), with the sensing signal stored in the accumulation capacitors Cf, and the accumulation capacitors Cf reset for example short circuited via the switches RST in the accumulator block 16) at each period (for example during the RST phases).

In operation as discussed previously a signal Vout_ACC is accumulated at the output of the accumulator circuit 16 with alternate signs in subsequent periods (for example with positive sign in "even" periods and negative sign in "odd" periods).

As a result of operation as discussed previously, the signal at the input of the accumulator circuit 16 will include:
 a useful signal $V_S$ modulated at $F_{spin}/2$,
 the Hall offset signal $Offset_{Hall}$ including two components, one at $F_{spin}$ and one at $3*F_{spin}$, and
 the offset from amplifier 12, namely $Offset_{A1}$, at $2*F_{spin}$.

In the arrangement as exemplified herein, after four accumulations, in the signal at the output of the accumulator circuit 16, namely Vout_ACC, $V_S$ will still be at $F_{spin}/2$, while $Offset_{Hall}$ and $Offset_{A1}$ will be cancelled thanks to the zeroes of the transfer function of the four-level accumulation.

On top of $V_s$ there will also be an offset $Offset_{accumulator}$ of the operational amplifier(s) in the accumulator circuit 16, with such an offset $Offset_{accumulator}$ being adapted to be regarded as constant at DC: more to the point this applies to the signal Vout_ACC as re-sampled in the (for example sample & hold) circuit 18 controlled by the signal V(SAMPLE) of FIG. 3.

The demodulator (for example sample and hold circuit) circuit 18 after the accumulator circuit 16 may include two pairs of input switches configured for sampling the incoming signal from the accumulator circuit 16 with alternate positive and negative signs, with a sampling frequency that is equal to the spinning frequency $F_{spin}$, thus acting as demodulator at $F_{chop}=F_{spin}/2$, that is at half the spinning frequency $F_{spin}$.

After this demodulation, the useful signal $V_S$ is at DC (or, to be more precise, in a band+/−$F_b$ around DC), while $V_{OACC}$ is moved to $F_{spin}/2$, given that the sample and hold sampling frequency is equal to the spinning frequency $F_{spin}$.

At this point all the offset voltages generated by the Hall sensor and by the various amplifiers are cancelled, with the exception of the offset voltage of the operational amplifier(s) in the accumulator circuit 16: however this is modulated at $F_{spin}/2$ and so can be reduced by low pass continuous time filters for example 20 and (possibly) 22 that follow the demodulator (for example sample and hold) circuit 18.

As indicated, in one or more embodiments a (first order) low-pass filter can be embedded in the demodulator (sample and hold) circuit 18.

Also, it was observed that the offset contribution due the operational amplifier(s) in the accumulator circuit 16 is small in comparison with the useful signal: in fact the useful signal has been already amplified by the gain of the amplifier stage 12, multiplied by four (that is the intrinsic gain of the accumulator circuit 16).

By way of recap, FIG. 4 provides a "frequency-domain" representation of the arrangement exemplified herein where the modulation features of the signal components at the output of the various circuits are summarized for immediate reference.

Spinning Circuit 10
Signal (useful): $2F_{spin}$
Offset$_{Hall}$: $F_{spin}$
Amplifier Circuit 12
Signal: $2F_{spin}$
Offset$_{Hall}$: $F_{spin}$
Offset$_{A1}$: DC
Demodulator Circuit 14
Signal: $F_{spin}/2$
Offset$_{Hall}$: $F_{spin}+3F_{spin}$
Offset$_{A1}$: $2F_{spin}$
Accumulator Circuit 16
Signal: $F_{spin}/2$
Offset$_1$: cancelled
Offset$_{accumulator}$: DC
Offset$_{A1}$: cancelled
Demodulator Circuit 18
Signal: DC
Offset$_{accumulator}$: $F_{spin}/2$ It will otherwise be recalled that the "useful" signal lies in fact in a band +/−$F_b$, so that, for instance, Signal: DC actually means Signal: +/−$F_b$ around DC.

In one or more embodiments a circuit may include:

a spinning circuit (for example 10) configured for receiving signals (for example four signals V1, V2, V3, V4) from a Hall sensor (for example H) in a spinning readout pattern of subsequent readout phases, the pattern cyclically repeated at a spinning frequency (for example $F_{spin}$).

Such a spinning readout pattern, as applicable to a Hall sensor having a plurality of pairs of mutually opposed pads (for instance V1 and V3, V2 and V4 in FIG. 1), includes (in a manner known to those of skill in the art) subsequent adjacent phases wherein a bias current "spins" ("down", "to the left", "up", "to the right", "down" and so on, that is by angular steps of, for instance, 90° as exemplified in FIG. 1) that is flows between a first pair of opposed sensor pads (see V1 and V3 in portion a) of FIG. 1) and an output voltage is sensed across a second pair (different from the first pair, e.g. V2 and V4) of opposed sensor pads, with the first and second pairs of pads "rotated" or "spun" (clockwise or counterclockwise), that is varied stepwise (e.g., by 90° steps) according to the ordered sequence of the pads: see, for instance the bias current Ipol subsequently flowing from V1 to V3 in portion a), from V2 to V4 in portion b), from V3 to V1 in portion c), and from V4 to V2 in portion d) of FIG. 1), so that at each rotation/spinning step each pad is, so to say, "replaced" by an adjacent pad in the sequence when spinning proceeds for one readout phase to an adjacent phase.

In one or more embodiments, the spinning circuit (10) may be configured for reversing (inverting) the polarity of the sensor signals for every two subsequent non-adjacent readout phases in the readout pattern (for example V3−V1 inverted to V1−V3 and V4−V2 inverted to V2−V4 in Phases 1 and 3 after Phase RST, with Phases 1 and 3 being subsequent yet non-adjacent due to the presence of Phase 2 interleaved therebetween), a signal storage circuit (for example 14), including a first (for example C1, C4) and a second (for example C3, C2) set of signal storage capacitors, an accumulation circuit (for example 16) including a set of accumulation capacitors (for example Cf), a network of switches (for example F1, F2) selectively actuatable (for example via signals V(F1) and V(F2)) for coupling the first and second set of signal storage capacitors in the signal storage circuit with the output from the spinning circuit (10, for example through the amplifier 12) and with the accumulation capacitors in the accumulation circuit, wherein the switches in the network of switches are actuatable (configured to be actuated) synchronously with the phases in the spinning readout pattern in subsequent alternating first and second periods (see for example the previous description of Period 1 and Period 2), with the output from the spinning circuit stored with alternating opposite signs on the first and second set of signal storage capacitors and the sensing signal stored in the first and second set of signal storage capacitors accumulated on the accumulation capacitors with alternate signs in subsequent periods (see again the previous description of Period 1 and Period 2), a demodulator circuit (for example 18) active on the signal from the accumulation circuit with a demodulation frequency (for example $F_{chop}=F_{spin}/2$) half the spinning frequency (for example $F_{spin}$).

In one or more embodiments, the accumulation capacitors in the accumulation circuit may be resettable (configured to be reset, for example via the switches RST) at each period in said subsequent alternating first and second periods.

In one or more embodiments, the accumulation capacitors in the accumulation circuit may be resettable at intervals of four accumulation phases of the signal from the spinning circuit stored in the first and second set of signal storage capacitors.

In one or more embodiments, the demodulator circuit may include a sample and hold circuit, actuatable (configured to be actuated) for sampling the signal from the accumulation circuit with alternate positive and negative signs with a sampling frequency equal to said spinning frequency.

One or more embodiments may include an amplifier stage (for example 12) between the spinning circuit and the signal storage circuit.

One or more embodiments may include at least one low-pass filter (for example 20, 22) active on the output from the demodulator circuit to filter out the accumulation circuit offset (for example Offset$_{accumulator}$).

One or more embodiments may include a low-pass filter at least partly (for example 20) integrated in the demodulator circuit.

A device according to one or more embodiments may include:

a Hall sensor (for example H) providing Hall sensor signals (for example four signals V1, V2, V3, V4), a circuit according to one or more embodiments, the spinning circuit (for example 10) in the circuit coupled with the Hall sensor for receiving therefrom said signals in said spinning readout pattern of subsequent readout phases.

In one or more embodiments a method may include:

receiving signals from a Hall sensor in a spinning readout pattern of subsequent readout phases, the pattern cyclically repeated at a spinning frequency, by reversing (inverting) the polarity of the sensor signals in two non-adjacent readout phases in the readout pattern, storing the sensor signals with said reversed polarity in a first and a second set of signal storage capacitors and accumulating the sensor signals stored in a set of accumulation capacitors, by selectively feeding the sensor signals with said reversed polarity to the first and second set of signal storage capacitors synchronously with the phases in the spinning readout pattern in subsequent alternating first and second periods, and the sensor signals with reversed polarity stored with alternating opposite signs on the first and second set of signal storage capacitors accumulated on the accumulation capacitors with alternate signs in subsequent periods in the subsequent alternating first and second periods, demodulating the accumulated signal with a demodulating frequency half said spinning frequency.

One or more embodiments, may thus involve a reversed polarity of the sensors signals for (every) two subsequent, non-adjacent readout phases. In contrast to known spinning techniques, in one or more embodiments the polarity of the sensor signals may be reversed at every phase as discussed previously, so that the resulting read-out pattern of the useful signal is plus, minus, plus, minus.

In one or more embodiments, the charge accumulated on C1, C2, C3 and C4 may be completely transferred to the capacitors Cf thanks to the operational amplifiers (opamp) 16a.

This may be advantageous over arrangements that do not contemplate the presence of such an opamp, so that the charge may not be completely transferred (for instance with charge sharing only). An arrangement as exemplified herein may thus facial having a gain in the place of an attenuation of the signal.

In one or more embodiments, the readout chain, starting from block 10, may process the signals V1, V2, V3 and V4 using the same circuits in a time multiplex arrangement, thus overcoming the limitations of those arrangements providing distinct circuits for reading purposes.

As noted, one or more embodiments may include:
accumulation capacitors (for instance Cf) in the accumulation circuit block built around the opamp 16a that are resettable at intervals of (for instance) four accumulation phases of the signal from the spinning circuit stored in the first and second sets of signal storage capacitors (for instance C1, C4 and C3, C2, respectively), and/or
a sample and hold circuit block in the demodulator circuit block actuatable for sampling the signal from the accumulation circuit block with alternate positive and negative signs with a sampling frequency corresponding to the spinning frequency F spin, that is the frequency at which the bias current Ipol (and the sensing voltages) "spin" by angular steps (of 90° for instance) in the spinning readout pattern.

Also, it will be appreciated that one or more embodiments may involve signals and circuits that are fully differential, a differential arrangement exhibiting a good immunity to external noise.

Without prejudice to the underlying principles, the details and embodiments may vary, even significantly, with respect to what has been described by way of example only, without departing from the extent of protection.

The extent of protection is defined by the annexed claims. The claims are an integral part of the technical teaching provided herein.

The invention claimed is:

1. A circuit, comprising:
a Hall sensor configured to generate a plurality of Hall sensor signals;
a spinning circuit connected to the Hall sensor and configured to generate from said plurality of Hall sensor signals a sensing signal between a first signal line and a second signal line;
a signal storage circuit having a first input node coupled to the first signal line and a second input node coupled to the second signal line to receive said sensing signal and having a first output node and a second output node;
said signal storage circuit including:
a first signal storage capacitor;
a second signal storage capacitor;
a third signal storage capacitor;
a fourth signal storage capacitor; and
a network of switches comprising:
a first set of switches configured to be simultaneously actuated by a first clock signal during a first switching phase to:
connect first terminals of the first and fourth signal storage capacitors to the first and second input nodes, respectively, of the signal storage circuit;
connect second terminals of the first and fourth signal storage capacitors to a reference node;
connect first terminals of the second and third signal storage capacitors to the reference node; and
connect second terminals of the second and third signal storage capacitors to the first and second output nodes, respectively, of the signal storage circuit; and
a second set of switches configured to be simultaneously actuated by a second clock signal during a second switching phase to:
connect the first terminals of the second and third signal storage capacitors to the second and first input nodes, respectively, of the signal storage circuit;
connect the second terminals of the second and third signal storage capacitors to the reference node;
connect the first terminals of the first and fourth signal storage capacitors to the reference node; and
connect the second terminals of the first and fourth signal storage capacitors to the first and second output nodes, respectively, of the signal storage circuit;
clock circuitry configured to generate the first and second clock signals with a 180° phase shift relative to each other to alternate between the first switching phase and second switching phase;
an accumulation circuit having a third input and fourth input connected to the first output node and second output node, respectively, of the signal storage circuit and having a third output node and a fourth output node, wherein the accumulation circuit is configured to accumulate in alternating first and second periods, each period of the first and second periods including a reset of the accumulation circuit and at least one alternation of the first and second switching phases; and
a demodulator circuit configured to demodulate an accumulation signal output from the third and fourth output nodes of the accumulation circuit.

2. The circuit of claim 1, wherein the accumulation circuit comprises:
a differential amplifier having first and second input terminals connected to the third input and fourth input of the accumulation circuit and first and second output terminals connected to the third output node and the fourth output node of the accumulation circuit;
a first accumulation capacitor coupled between the first input terminal and first output terminal;
a second accumulation capacitor coupled between the second input terminal and second output terminal;
a first reset switch configured to be actuated by said reset and connected in parallel with the first accumulation capacitor between the first input terminal and first output terminal; and
a second reset switch configured to be actuated by said reset and connected in parallel with the second accumulation capacitor between the second input terminal and second output terminal.

3. The circuit of claim 1, wherein the first set of switches of the network of switches comprise:
a first switch connecting the first input node of the signal storage circuit and the first terminal of the first signal storage capacitor;
a second switch connecting the second input node of the signal storage circuit and the first terminal of the fourth signal storage capacitor;
a third switch connecting the first output node of the signal storage circuit and the second terminal of the second signal storage capacitor; and
a fourth switch connecting the second output node of the signal storage circuit and the second terminal of the third signal storage capacitor;
wherein the first, second, third and fourth switches are configured to be simultaneously actuated by the first clock signal.

4. The circuit of claim 3, wherein the second set of switches of the network of switches further comprises:
a fifth switch connecting the first input node of the signal storage circuit and the first terminal of the third signal storage capacitor;
a sixth switch connecting the second input node of the signal storage circuit and the first terminal of the second signal storage capacitor;
a seventh switch connecting the first output node of the signal storage circuit and the second terminal of the first signal storage capacitor; and
an eighth switch connecting the second output node of the signal storage circuit and the second terminal of the fourth signal storage capacitor;
wherein the fifth, sixth, seventh and eighth switches are configured to be simultaneously actuated by the second clock signal.

5. The circuit of claim 1, further comprising a differential amplifier coupled between an output of the spinning circuit and the first and second input nodes of the signal storage circuit.

6. The circuit of claim 1, wherein the demodulator circuit is configured to sample the signal output from the third and fourth output nodes of the accumulation circuit.

7. The circuit of claim 1, wherein the first period comprises the reset of the accumulation circuit and the alternation of the first and second switching phases with accumulation by the accumulation circuit having a first polarity; and wherein the second period comprises the reset of the accumulation circuit and the alternation of the first and second switching phases with accumulation by the accumulation circuit having a second polarity that is opposite to the first polarity.

8. A circuit, comprising:
a Hall sensor configured to generate a plurality of Hall sensor signals;
a spinning circuit connected to the Hall sensor and configured to generate from said plurality of Hall sensor signals a sensing signal between a first signal line and a second signal line;
a first capacitor;
a second capacitor;
a third capacitor;
a fourth capacitor;
a first switch configured to be selectively actuated to connect the first signal line to a first terminal of the first capacitor in response to a first clock signal;
a second switch configured to be selectively actuated to connect a second terminal of the first capacitor to a reference node in response to the first clock signal;
a third switch configured to be selectively actuated to connect a first terminal of the second capacitor to the reference node in response to the first clock signal;
a fourth switch configured to be selectively actuated to connect a second terminal of the second capacitor to a first output node in response to the first clock signal;
a fifth switch configured to be selectively actuated to connect a first terminal of the third capacitor to the reference node in response to the first clock signal;
a sixth switch configured to be selectively actuated to connect a second terminal of the third capacitor to a second output node in response to the first clock signal;
a seventh switch configured to be selectively actuated to connect the second signal line to a first terminal of the fourth capacitor in response to the first clock signal;
an eighth switch configured to be selectively actuated to connect a second terminal of the fourth capacitor to the reference node in response to the first clock signal;
wherein said first clock signal is configured to simultaneously actuate said first through eighth switches;
a ninth switch configured to be selectively actuated to connect the first terminal of the first capacitor to the reference node in response to a second clock signal;
a tenth switch configured to be selectively actuated to connect the second terminal of the first capacitor to the first output node in response to the second clock signal;
an eleventh switch configured to be selectively actuated to connect the second signal line to the first terminal of the second capacitor in response to the second clock signal;
a twelfth switch configured to be selectively actuated to connect the second terminal of the second capacitor to the reference node in response to the second clock signal;
a thirteenth switch configured to be selectively actuated to connect the first signal line to the first terminal of the third capacitor in response to the second clock signal;
a fourteenth switch configured to be selectively actuated to connect the second terminal of the third capacitor to the reference node in response to the second clock signal;
a fifteenth switch configured to be selectively actuated to connect the first terminal of the fourth capacitor to the reference node in response to the second clock signal;
a sixteenth switch configured to be selectively actuated to connect the second terminal of the fourth capacitor to the second output node in response to the second clock signal;

wherein said second clock signal is configured to simultaneously actuate said ninth through sixteenth switches;
clock circuitry configured to generate the first and second clock signals with a 180° phase shift relative to each other;
an accumulation circuit having a third input node and fourth input node connected to the first output node and the second output node, respectively, and having a third output node and a fourth output node; and
a demodulator circuit configured to demodulate an accumulation signal output from the third and fourth output nodes of the accumulation circuit.

9. The circuit of claim 8, wherein the accumulation circuit comprises:
   a differential amplifier having first and second input terminals connected to the third and fourth input nodes and first and second output terminals connected to the third and fourth output nodes;
   a first accumulation capacitor coupled between the first input terminal and first output terminal;
   a second accumulation capacitor coupled between the second input terminal and second output terminal;
   a first reset switch connected in parallel with the first accumulation capacitor and configured to be actuated by a reset signal; and
   a second reset switch connected in parallel with the second accumulation capacitor and configured to be actuated by said reset signal.

10. The circuit of claim 8, further comprising a differential amplifier coupled to an output of the spinning circuit.

11. The circuit of claim 8, wherein the demodulator circuit is configured to be actuated in response to a sampling signal to sample the signal output from the third and fourth output nodes of the accumulation circuit.

* * * * *